United States Patent
Akagi et al.

(10) Patent No.: US 6,408,013 B1
(45) Date of Patent: Jun. 18, 2002

(54) SEMICONDUCTOR LASER CONTROL METHOD AND SEMICONDUCTOR LASER CONTROL APPARATUS

(75) Inventors: Toshiya Akagi, Neyagawa; Yoshiyuki Miyabata, Yawata, both of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/544,545

(22) Filed: Apr. 6, 2000

(30) Foreign Application Priority Data

Apr. 9, 1999 (JP) .......................................... 11-103152

(51) Int. Cl.[7] ............................................... H01S 3/10
(52) U.S. Cl. .................................... 372/29.021; 372/31
(58) Field of Search .............................. 372/29.021, 31, 372/29.02

(56) References Cited

U.S. PATENT DOCUMENTS

RE37,524 E * 1/2002 Taguchi ................. 372/29.011

6,345,062 B1 * 2/2002 Taguchi et al. .......... 372/38.01

* cited by examiner

Primary Examiner—James W. Davie
(74) Attorney, Agent, or Firm—Parkhurst & Wendel, LLP

(57) ABSTRACT

A semiconductor laser control method and a semiconductor laser control apparatus allow an outgoing radiation power of a semiconductor laser to be accurately stabilized to a desired value even if a characteristic of the semiconductor laser changes due to temperature variations or deterioration of life. The characteristic of a semiconductor laser is measured by a semiconductor laser characteristic detection unit and a target value is corrected by a target value correction unit based on a threshold current and differential quantum efficiency obtained from the measurement result. A power control unit controls the semiconductor laser by comparing the corrected target value with the output of a power detection unit, making it possible to achieve a desired outgoing radiation power of the semiconductor laser with high accuracy even if the threshold current or differential quantum efficiency of the semiconductor laser changes due to temperature variations or deterioration of life.

11 Claims, 9 Drawing Sheets

SEMICONDUCTOR LASER CONTROL METHOD AND SEMICONDUCTOR LASER CONTROL APPARATUS

FIELD OF THE INVENTION

The present invention relates to a semiconductor laser control method and a semiconductor laser control apparatus to stabilize the output of outgoing radiation power of an apparatus that records or reproduces information on an optical information recording medium using a semiconductor laser as a light source.

BACKGROUND OF THE INVENTION

For an apparatus that reproduces or records information on an optical information recording medium using a laser light source, a semiconductor laser is used as the light source for the purposes of reducing the size, reducing power consumption and improving mass-productivity, etc.

FIG. 9 shows a current-optical output characteristic of a semiconductor laser. A current with which a semiconductor laser starts oscillation as a laser and starts to output power is called a "threshold current Ith" and the efficiency of optical output with respect to a drive current equal to or greater than the threshold current Ith is called "differential quantum efficiency η. Since this characteristic is extremely unstable, control is normally exercised to stabilize output power by detecting outgoing radiation power of a semiconductor laser and providing feedback for a semiconductor laser drive circuit.

FIG. 8 is a block diagram showing an outlined configuration of a conventional semiconductor laser control apparatus. In FIG. 8, reference numeral 31 denotes a semiconductor laser; 32, a power detection means for detecting power output from the semiconductor laser 31; 33, an outgoing radiation power target value; 34, a power control means for controlling outgoing radiation power of the semiconductor laser 31 to a desired power level by comparing the output value of the power detection means 32 and target value 33; 35, a CPU; and 36, a control signal.

The principle of operation of the semiconductor laser control apparatus with such a configuration is explained.

Here, suppose the outgoing radiation power of the semiconductor laser 31 is $P_{out}$, sensitivity detected by the power detection means 32 is K, the output signal of the power detection means 32 is X, the target value 33 is REF, an error signal obtained by subtracting the output signal X of the power detection means 32 from the target value 33 in the power control means 34 is Y, an amplification factor of the power control means 34 is G, and an output current of the power control means 34 is I. Then, if a feedback loop is configured only focused on a DC current, the following are obtained:

$$Y = REF - X \quad \text{Equation 1}$$

$$I = G \cdot Y \quad \text{Equation 2}$$

$$P_{out} = \eta \cdot (I - I_{th}) \quad \text{Equation 3}$$

$$X = K \cdot P_{out} \quad \text{Equation 4}$$

If X, Y and I are erased from the Equations 1, 2, 3 and 4, $P_{out}$ is obtained as follows:

Equation 5

$$P_{out} = \frac{REF}{K} - \frac{1}{1+G\cdot\eta\cdot K} \cdot \frac{REF}{K} - \frac{1}{1+G\cdot\eta\cdot K} I_{th}$$

Generally, in a linear feedback control system, only the second term of the right side of the Equation 5 exists as a steady-state deviation of the control system. However, the semiconductor laser 31 has a current-optical output characteristic as shown in FIG. 9 and the threshold current $I_{th}$ brings about the third term of the right side of the Equation 5. If the Equation 5 is solved with respect to the target value REF, REF is given in the following Equation 6:

$$REF = K \cdot P_{out} + H \quad \text{Equation 6}$$

where H is a correction term and is given:

$$H = P_{out}/G \cdot \eta + I_{th}/G \quad \text{Equation 7}$$

Therefore, to obtain the desired power, it is only necessary to set to the target value (REF) determined by the Equations 6 and 7. Instead of obtaining the target value by the Equations 6 and 7, the conventional method used to adjust the target value so that the semiconductor laser outgoing radiation power $P_{out}$ would consequently reach the desired power through power adjustment carried out in the manufacturing process.

However, the conventional control method had a basic problem that variations of $I_{th}$ or η due to variations in the operating temperature or deterioration of the semiconductor laser would produce an error in output power.

When the operating temperature of the semiconductor laser increases from a temperature T1 to T2, the threshold current $I_{th}$ increases and the differential quantum efficiency η decreases as shown in the current-optical output characteristic in FIG. 9. Since the correction term H of the Equation 7 includes the threshold current $I_{th}$ and the differential quantum efficiency η, the value of the correction term H will also change. Therefore, the Equation 6 also changes, with the result that the outgoing radiation power $P_{out}$ of the semiconductor laser 31 changes.

Since the adjustment of the target value in the Equation 6 takes place in the manufacturing process, the correction term H is a value at the time of adjustment. Suppose the threshold current of the semiconductor laser during the process adjustment is $I_{th1}$; differential quantum efficiency is $\eta_1$; outgoing radiation power of the semiconductor laser during the adjustment is $P_{out1}$; and the correction term is $H_1$, then, the predetermined value ($REF_1$) is given from the Equations 6 and 7:

$$REF_1 = K \cdot P_{out1} + H_1 \quad \text{Equation 8}$$

and $$H_1 = P_{out1}/G \cdot \eta_1 + I_{th1}/G \quad \text{Equation 9}$$

If Equations 8 and 9 are solved with respect to $P_{out1}$ the following expression is obtained:

Equation 10

$$P_{out1} = \frac{G\cdot\eta_1\cdot K}{1+G\cdot\eta_1\cdot K} \cdot \frac{REF_1}{K} - \frac{\eta_1}{1+G\cdot\eta_1\cdot K} I_{th1}$$

On the other hand, the characteristic of the semiconductor laser changes under temperature conditions different from those at the time of process adjustment or deterioration of life due to operation for an extended period of time. Suppose the threshold current is $I_{th2}$ and differential quantum efficiency is $\eta_2$ at this time. In this case, the outgoing radiation power $P_{out2}$ of the semiconductor laser is obtained by replacing $I_{th1}$, and $\eta_1$ in the Equation 10 by $i_{th2}$ and $\eta_2$ respectively.

Equation 11

$$P_{out2} = \frac{G \cdot \eta_2 \cdot K}{1 + G \cdot \eta_2 \cdot K} \cdot \frac{REF_1}{K} - \frac{\eta_2}{1 + G \cdot \eta_2 \cdot K} I_{th2}$$

Here, suppose the error in the outgoing radiation power of $P_{out2}$ corresponding to $P_{out1}$ is $\Delta P = (P_{out2} - P_{out1})$, Equation 12

$$\Delta P = \left( \frac{G \cdot \eta_2 \cdot K}{1 + G \cdot \eta_2 \cdot K} - \frac{G \cdot \eta_1 \cdot K}{1 + G \cdot \eta_1 \cdot K} \right) \cdot \frac{REF_1}{K} -$$
$$\left( \frac{\eta_2}{1 + G \cdot \eta_2 \cdot K} I_{th2} - \frac{\eta_1}{1 + G \cdot \eta_1 \cdot K} I_{th1} \right)$$

Since the total loop gain $G \cdot \eta_1 \cdot K$ and $G \cdot \eta_2 \cdot K$ are set to values sufficiently greater than 1, the following approximations can be used:

$1 + G \cdot \eta_1 \cdot K \approx G \cdot \eta_1 \cdot K$  Equation 13

$1 + G \cdot \eta_2 \cdot K \approx G \cdot \eta_2 \cdot K$  Equation 14

If this is applied to the Equation 12, $\Delta P$ is obtained as follows:

$\Delta P = -(I_{th2} - I_{th1})/G \cdot K$  Equation 15

As an example, the outgoing radiation power error $\Delta P$ is obtained for a semiconductor laser with a wavelength of 650 nm. Here, suppose a process adjustment is carried out at 25° C. and the threshold current is $I_{th1}$, and differential quantum efficiency is $\eta_1$ at that time. On the other hand, suppose the actual operation is performed at 60° C. and the threshold current is $I_{th2}$ and differential quantum efficiency is $\eta_2$ at that time. Typical temperature variations are numerically expressed as follows:

$I_{th1} = 50$ (mA)  Equation 16

$\eta_1 = 0.7$ (W/A)  Equation 17

$I_{th2} = 100$ (MA)  Equation 18

$\eta_2 = 0.6$ (W/A)  Equation 19

Suppose a total loop gain $G \cdot \eta_1 \cdot K$ is:

$G \cdot \eta_1 \cdot K = 100$  Equation 20

Then, $G \cdot K$ is obtained from the Equations 17 and 20:

$G \cdot K = 100/0.7 = 142.9$ (A/W)  Equation 21

$\Delta P$ at this time is calculated as:

$\Delta P = -(100 - 50)/142.9 = -0.35$ (mW)  Equation 22

From this, it is known that an error as great as $-0.35$ mW is produced in the outgoing radiation power of the semiconductor laser.

By the way, it is assumed that the amplification factor G of the power control means 34 is constant, but there is also another control method of changing G according to a value $\eta$ so that the total loop gain $G \cdot \eta \cdot K$ is constant. In this case, suppose the amplification factor of the power control means 34 during a process adjustment is $G_1$, the amplification factor of the power control means 34 when the semiconductor laser characteristic changes due to deterioration of life caused by temperature conditions different from those during the process adjustment and operation for an extended period of time is $G_2$, and the total loop gain is a constant value A.

$G_1 \cdot \eta_1 \cdot K = A$  Equation 23

$G_2 \cdot \eta_2 \cdot K = A$  Equation 24

Since the detection sensitivity K of the power detection means 32 is a fixed value, $G_1$ and $G_2$ are changed according to the differential quantum efficiencies $\eta_1$ and $\eta_2$ as a consequence. In this condition, the outgoing radiation power error $\Delta P$ is calculated as follows:

$\Delta P = -(\eta_2 \cdot I_{th2} - \eta_1 \cdot I_{th1})/(1 + A)$  Equation 25

Substitution of the above described Equation 16 of the semiconductor laser of a wavelength 650 nm, Equations 17, 18, 19 and a value of the total loop gain A, $A = 100$  Equation 26 into this Equation 25 yields:

Equation 27

$$\Delta P = -(0.6 \times 100 - 0.7 \times 50)/(1 + 100)$$
$$= -0.25 \text{ (mW)}$$

which is an improvement on the Equation 22, but there still is an error as great as $-0.25$ mW.

Furthermore, the present example describes a characteristic change of the semiconductor laser caused by temperature variations, but similar changes in the threshold current $I_{th}$ and differential quantum efficiency $\eta$ also take place due to deterioration of life with time, thus producing an error of outgoing radiation power for the same reason.

Thus, the conventional control method poses a problem of inability to provide stable power control against temperature variations or deterioration of life.

The present invention has been implemented taking into account the above described problems of the conventional art and it is an objective of the present invention to provide a method and apparatus for semiconductor laser control capable of accurately stabilizing outgoing radiation power of a semiconductor laser to a desired value even when the characteristic of the semiconductor laser changes due to temperature variations or deterioration of life.

SUMMARY OF THE INVENTION

In order to attain the above objective, the present invention includes a power detection means for detecting outgoing radiation power of a semiconductor laser, power control means for controlling the outgoing radiation power of the semiconductor laser to a desired power level by comparing an output value of this detection means and a target value, target value correction means for correcting the above described target value, and can obtain the desired outgoing radiation power of the semiconductor laser with high accuracy even if the threshold current and differential quantum efficiency of the semiconductor laser change after adjustment of the outgoing radiation power of the semiconductor laser by correcting the target value based on a threshold current and differential quantum efficiency of the semiconductor laser through this target value correction means.

The present invention further includes a temperature detection means and can obtain the desired outgoing radiation power of the semiconductor laser with high accuracy also in case of temperature variations by correcting the target value by detecting a threshold current and differential quantum efficiency of the semiconductor laser according to temperature variations of the semiconductor laser.

The present invention further includes a semiconductor laser operation time measurement means and can obtain the desired outgoing radiation power of the semiconductor laser with high accuracy also in the case of deterioration of life by correcting the target value by detecting a threshold current and differential quantum efficiency of the semiconductor laser according to operation over time of the semiconductor laser.

DESCRIPTION OF THE EMBODIMENTS

With reference now to the attached drawings, a semiconductor laser control apparatus according to embodiments of the present invention will be explained below.

Figure 1:
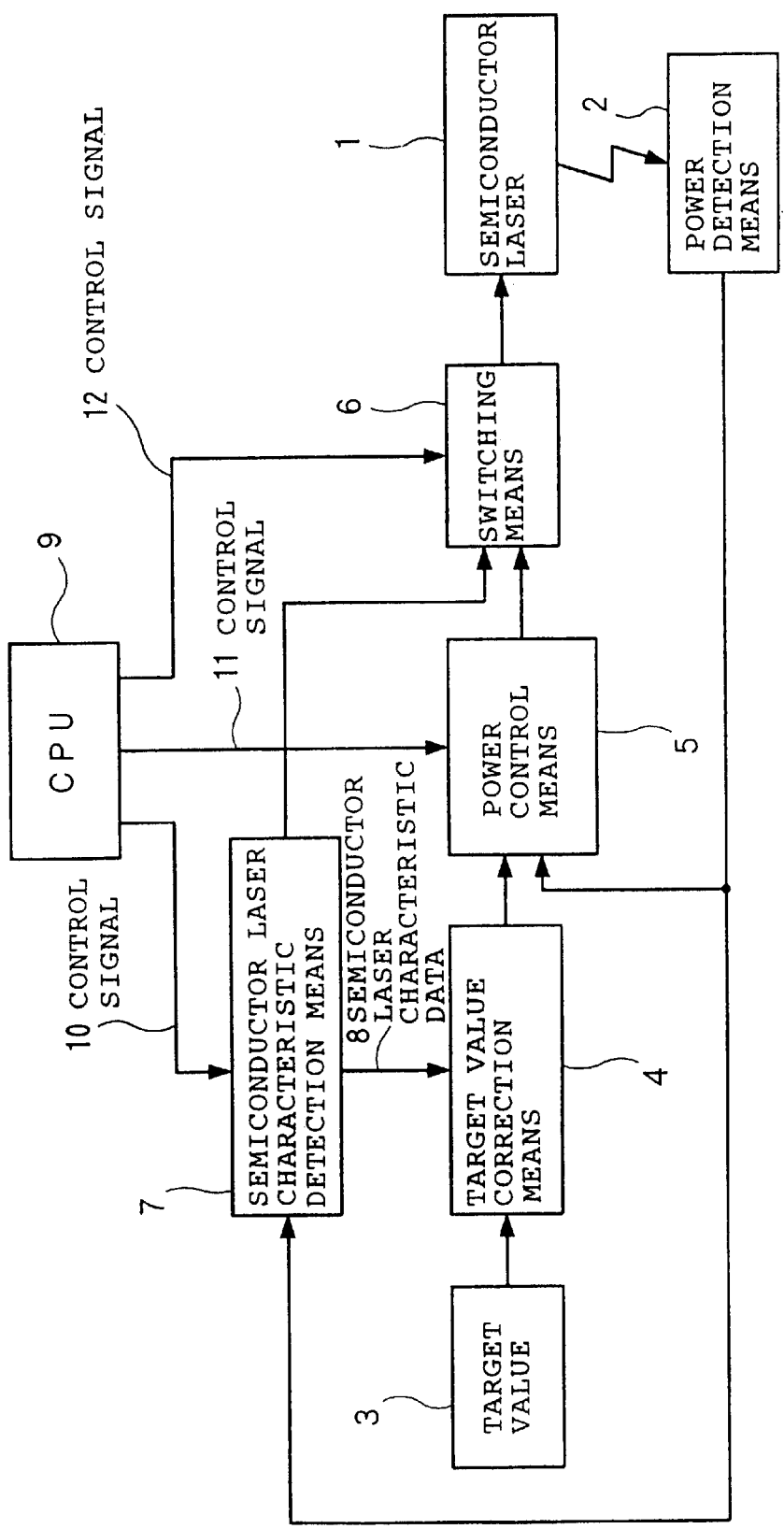
FIG. 1 is a block diagram showing an outlined configuration of a semiconductor laser control apparatus to explain a first embodiment of the present invention.

FIG. 1 is a block diagram showing an outlined configuration of a semiconductor laser control apparatus to explain a first embodiment of the present invention.

In FIG. 1, reference numeral 1 denotes a semiconductor laser; 2, power detection means; 3, a target value; 4, target value correction means; 5, power control means; 6, switching means; 7, semiconductor laser characteristic detection means; 8, semiconductor laser characteristic data; 9, a CPU (central processing unit); and reference numerals 10, 11 and 12 denote control signals output from the CPU 9.

Figure 2:
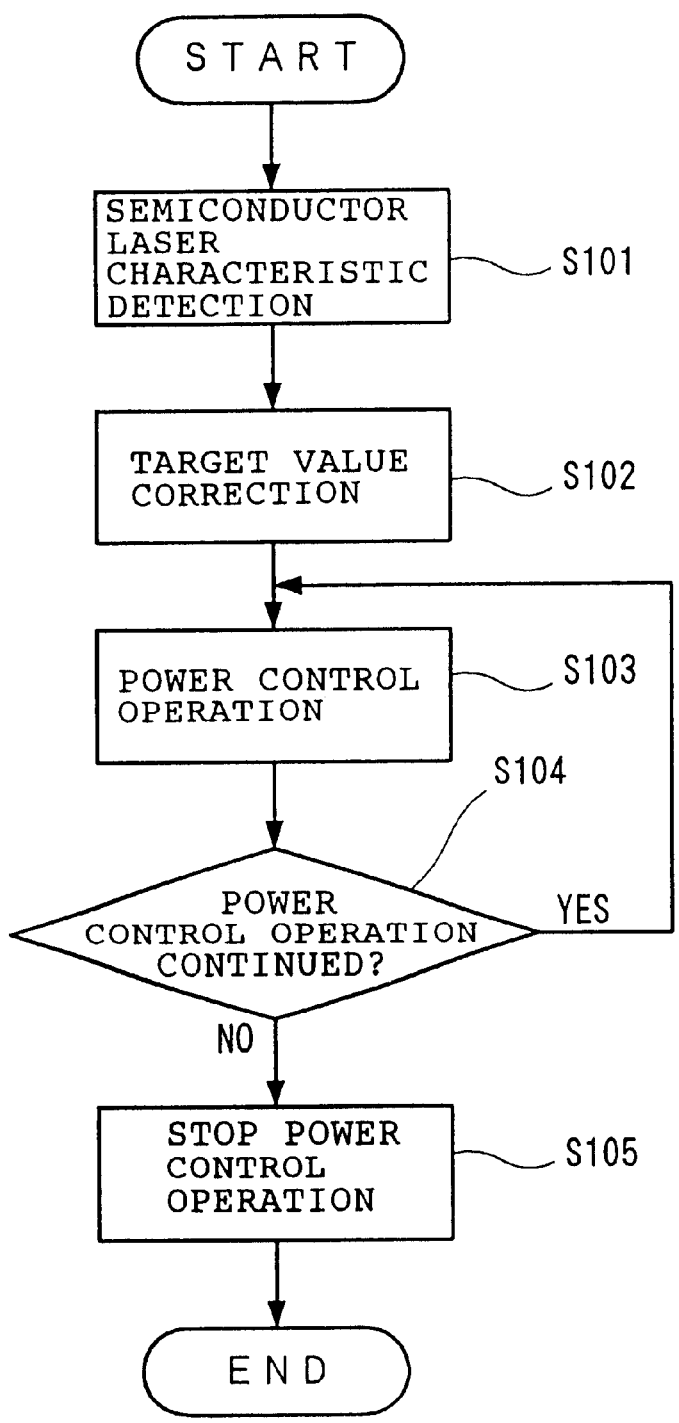
FIG. 2 is a flow chart showing an overall operation procedure of the first embodiment of the present invention.
Figure 3:
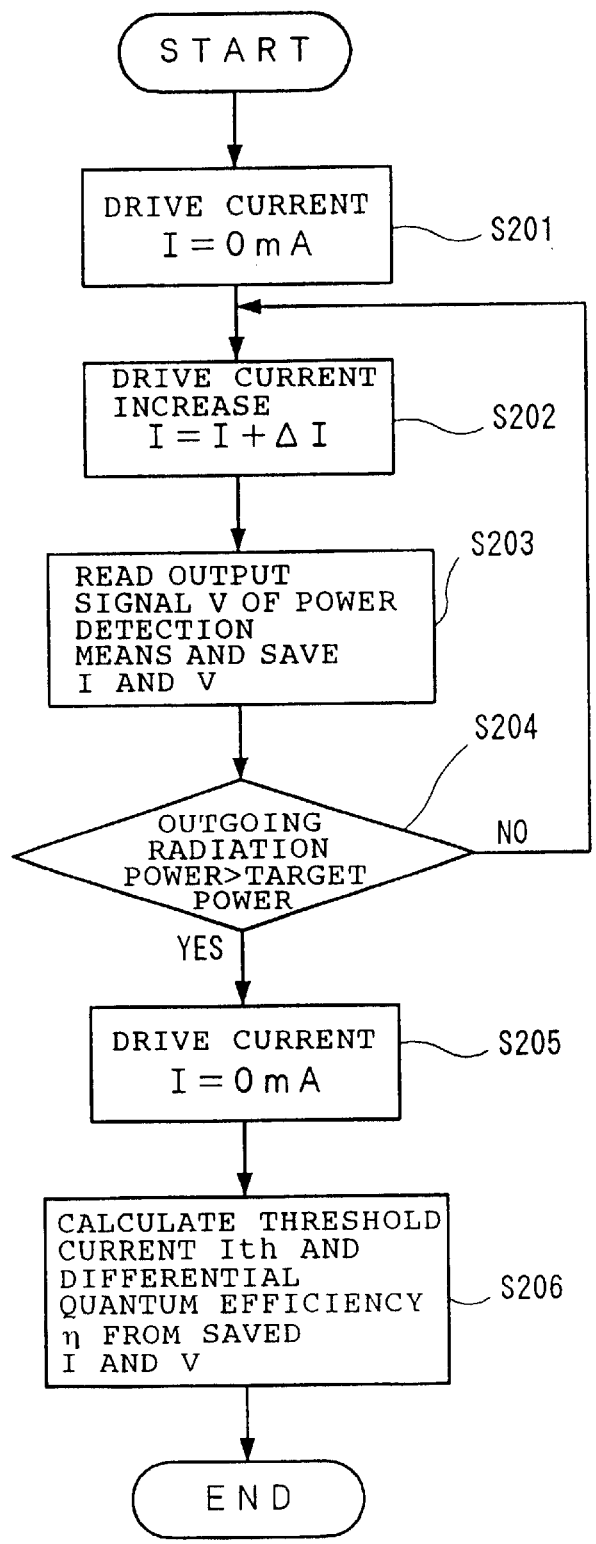
FIG. 3 is a flow chart showing an operation procedure of semiconductor laser characteristic detection means of the first embodiment of the present invention.

With reference to FIG. 2 and FIG. 3, an operation of the first embodiment will be explained. FIG. 2 is a flow chart showing a procedure for the main operation of the first embodiment of the present invention and FIG. 3 is a flow chart showing an operation procedure of semiconductor laser characteristic detection means.

First, an operation of detecting the characteristic of the semiconductor laser 1 is carried out (S101). Control signals 10 and 11 output from the CPU 9 stop both the semiconductor laser characteristic detection means 7 and the power control means 5 and through a control signal 12, the switching means 6 connects an output of the semiconductor laser characteristic means 7 to the semiconductor laser 1. The control signal 10 starts an operation of the semiconductor laser characteristic detection means 7 and first sets a drive current I for the semiconductor laser to "0" (S201).

Then, the drive current I is incremented by a certain volume $\Delta I$ (S202). An output signal V of the power detection means 2 at that time is read and saved together with the drive current (S203). The outgoing radiation power of the semiconductor laser 1 is calculated from the output signal of the power detection means 2 to determine whether it is larger than a desired target power or not (S204). If it is smaller, step S202 is returned to and the drive current I is increased. If it is larger, the drive current I is set to "0" (S205) and a threshold current Ith and differential quantum efficiency $\eta$ of the semiconductor laser 1 are calculated based on the above described saved I and V (S206). If the characteristic of the semiconductor laser 1 is obtained in this way, the semiconductor laser characteristic detection means 7 is stopped through the control signal 10.

This completes the operation of detecting the characteristic of the semiconductor laser 1 (S101).

Then, an operation of correcting the target value is carried out (S102). The target value 3 is given by multiplying a desired outgoing radiation power $P_{desired}$ of the semiconductor laser 1 by detection sensitivity K of the power detection means 2:

$$\text{Target value } 3 = K\, P_{desired} \qquad \text{Equation 28}$$

The target value correction means 4 calculates the correction term H obtained by replacing $P_{out}$ of the Equation 7 with $P_{desired}$ based on the threshold current $I_{th}$ and differential quantum efficiency $\eta$ of the semiconductor laser 1 sent with the semiconductor laser characteristic data 8 and adds this to the target value 3. As a result, the target value REF corrected by the above described Equation 6 is calculated as follows:

$$\text{REF} = K\, P_{deired} + P_{desird}/G\cdot\eta + I_{th}/G \qquad \text{Equation 29}$$

This REF is output to the power control means 5 and the operation of correcting the target value is completed (S102).

Then, power control operation is performed (S103). Through the control signal 12, the switching means 6 connects the output of the power control means 5 to the semiconductor laser 1. Operation of the power control means 5 is started based on the control signal 11. The power control means 5 finds an error by subtracting the output value of the power detection means 2 from the corrected target value REF, amplifies this error G times to drive the semiconductor laser 1. Once such a feedback loop is configured, the above described Equation 5 is established. By substituting the Equation 29 into REF of the Equation 5, the outgoing radiation power $P_{out}$ of the semiconductor laser 1 is given:

$$P_{out} = P_{desired} \qquad \text{Equation 30}$$

Thus, the desired power $P_{desired}$ can be obtained (S103).

In step S104, power control operation is continued or stopped through the control signal 11 and if it is continued, the procedure goes back to step S103 and if it is stopped, the procedure goes to step S105.

Finally in step S105, power control operation is stopped and the procedure ends.

As shown above, the semiconductor laser control apparatus of the first embodiment detects the characteristic of the semiconductor laser 1 before power control and corrects the target value 3 based on the threshold current and differential quantum efficiency obtained. Therefore, the semiconductor laser control apparatus can accurately obtain the desired outgoing radiation power even if the threshold current or differential quantum efficiency of the semiconductor laser 1 changes from the levels at the time of process adjustment. At the same time, the target value 3 itself can be obtained from a simple relational expression of the Equation 28, and therefore it is possible to easily obtain the corrected target value REF for other than the outgoing radiation power of the semiconductor laser 1 at the time of process adjustment, allowing accurate power control according to the target value 3.

Here, the semiconductor laser control apparatus of the first embodiment obtains the Equation 29 instep S102; in this case, however, even if the amplification factor G is changed according to the differential quantum efficiency η of the semiconductor laser 1 in such a way that the total loop gain A becomes a certain value, the result of the Equation 30 does not change. Therefore, the first embodiment is valid even in the case where the total loop gain A must be set to a certain predetermined value to secure stability of the feedback control system.

Moreover, the semiconductor laser control apparatus of the first embodiment has a configuration with only one target value, however since correction of the target value is not dependent on the desired outgoing radiation power as is clear from the Equation 7, it is also possible to have a configuration with at least two target values and input a selected target value to the target value correction means. In that case, it is possible to easily implement multi-value control of outgoing radiation power according to the number of target values.

Moreover, the semiconductor laser control apparatus of the first embodiment only performs semiconductor laser characteristic detection and target value correction before power control operation, but it is also possible to compare the target value 3 and the output of the power control means 2 during power control operation and stop power control operation when the comparison result is not within the allowable error range, and correct the target value by repeating this procedure once again. This is effective to suppress outgoing radiation power errors due to variations in the threshold current and differential quantum efficiency of the semiconductor laser due to temperature variations.

Furthermore, the semiconductor laser control apparatus of the first embodiment performs detection of the semiconductor laser characteristic and correction of the target value before power control operation, but it is also possible to save the last detected threshold current and differential quantum efficiency and perform power control using the corrected target value based on this value. In this case, it is possible to compare the target value 3 and the output of the power control means 2 when power control operation is stabilized and stop power control operation if the comparison result is not within the allowable error range and detect the characteristic of the semiconductor laser 1, correct the target value and then operate power control once again. This is effective when the time required for detection of the characteristic of the semiconductor laser 1 and correction of the target value becomes a problem in the system using the semiconductor laser control apparatus of the first embodiment and deterioration of power accuracy caused by a correction shift is within an allowable range.

Furthermore, the semiconductor laser control apparatus of the first embodiment performs detection of the characteristic of the semiconductor laser 1 and correction of the target value before power control operation, but it is also possible to perform power control operation before correcting the target value. In this case, it is also possible to compare the target value 3 and the output of the power control means 2 when power control operation is stabilized and stop power control operation if the comparison result is not within the allowable error range and detect the characteristic of the semiconductor laser 1, correct the target value and then operate power control once again. This is effective when the time required for detection of the characteristic of the semiconductor laser and correction of the target value becomes a problem in the system using the semiconductor laser control apparatus of the first embodiment and deterioration of power accuracy caused by a correction shift is within an allowable range.

Furthermore, with the semiconductor laser control apparatus of the first embodiment, the method of increasing the drive current for the semiconductor laser in the semiconductor laser characteristic detection procedure shown in FIG. 3 need not always have certain fixed increments, but can change the amount of increments according to, for example, whether a signal is output or not from the power detection means. Moreover, any concept of the drive current is acceptable as long as it provides the current-optical output characteristic of the semiconductor laser as a consequence. The drive current stop condition need not have the content shown in step S204 of FIG. 3 and any judgment criteria is acceptable as long as it allows the threshold current and differential quantum efficiency to be obtained stably.

Since life deterioration of the semiconductor laser shows the same characteristic change as that by temperature variations, the semiconductor laser control apparatus of the first embodiment is also effective against life deterioration of the semiconductor laser.

Figure 4:
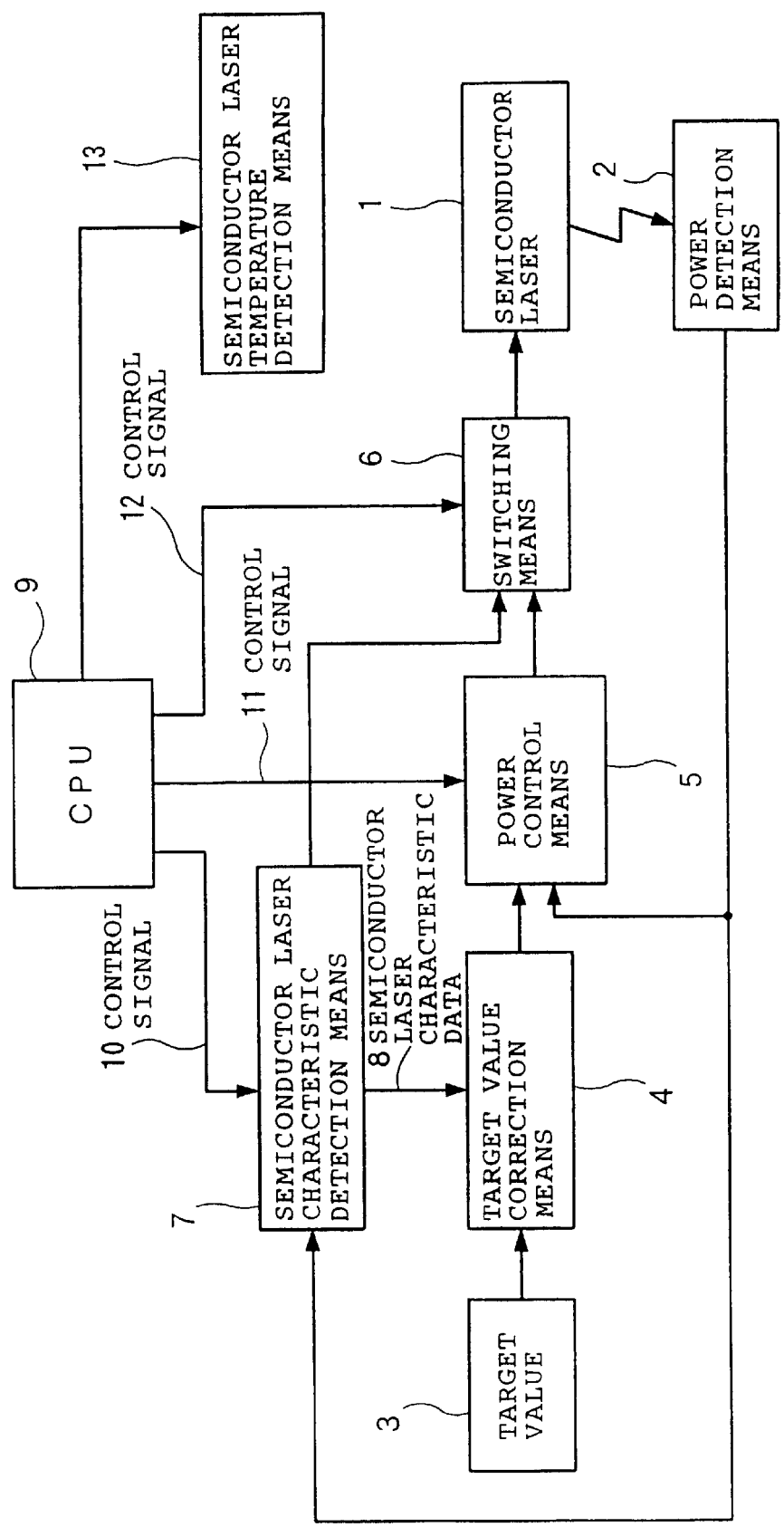
FIG. 4 is a block diagram showing an outlined configuration of a semiconductor laser control apparatus to explain a second embodiment of the present invention.

FIG. 4 is a block diagram showing an outlined configuration of a semiconductor laser control apparatus to explain a second embodiment of the present invention. In FIG. 4, the same components as those explained in FIG. 1 are assigned the same reference numerals and their detailed explanations are omitted. Reference numeral 13 denotes a semiconductor laser temperature detection means.

Figure 5:
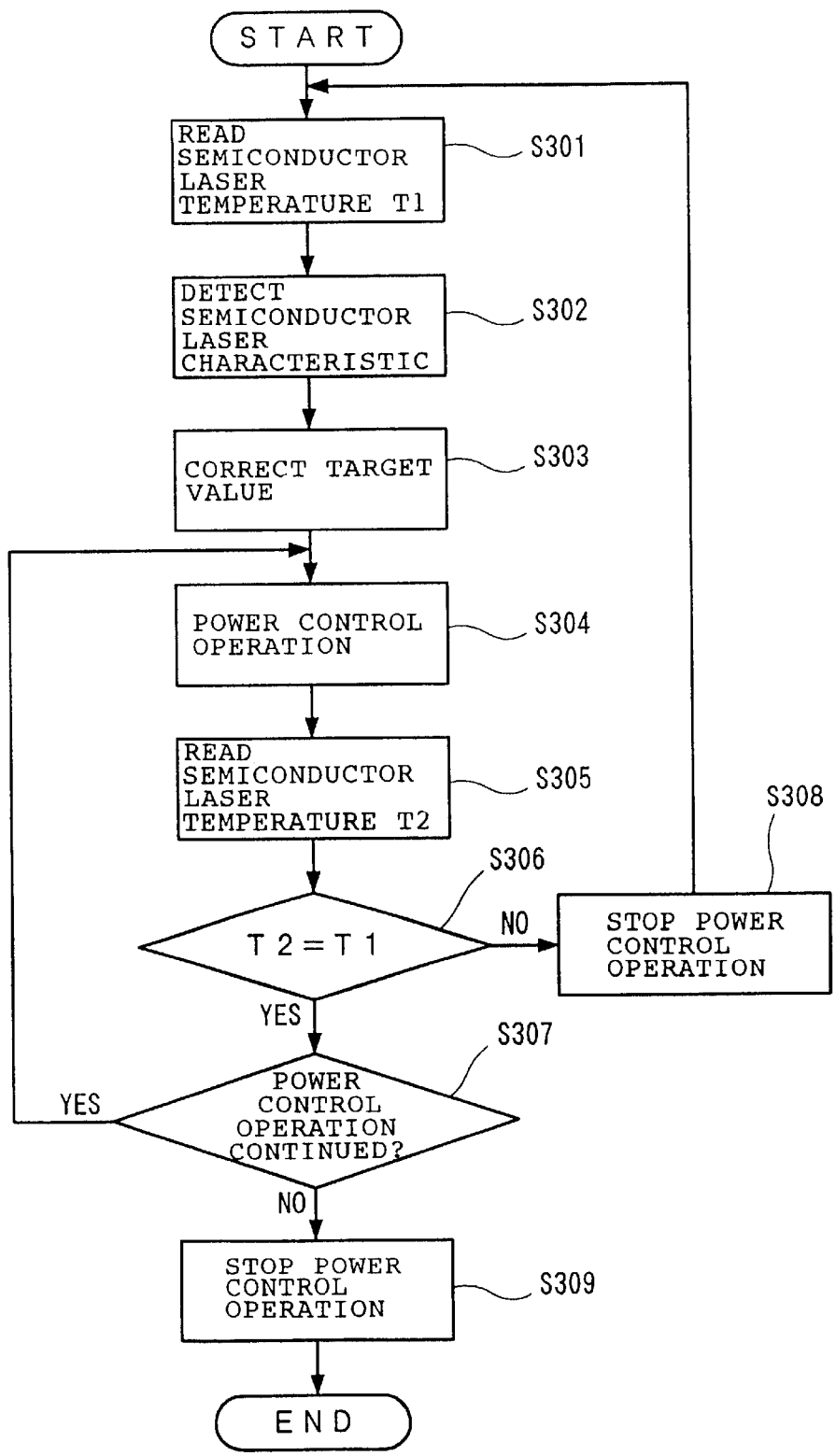
FIG. 5 is a flow chart showing an operation procedure of the second embodiment of the present invention.

FIG. 5 is a flowchart showing the procedure for operating the components of the second embodiment.

First, the CPU 9 reads temperature T1 from a semiconductor laser temperature detection means 13. This temperature T1 is the temperature when the characteristic of the semiconductor laser 1 is detected in step S302 (S301).

Then, in FIG. 5, steps S302, S303 and S304 are carried out and these are the same operation procedure and content as those in steps S101, S102 and S103 in FIG. 2 and therefore their explanations are omitted. As a consequence, the desired outgoing radiation power of the semiconductor laser 1 can be obtained with high accuracy.

After carrying out power control in step S304, the CPU 9 reads temperature T2 from the semiconductor laser temperature detection means 13 (S305).

Here, if temperature T2 during power control operation is equal to temperature T1 when the characteristic of the semiconductor laser 1 is detected, the characteristic of the semiconductor laser 1 is considered to remain unchanged and the procedure advances to step S307. However, if these temperatures are not the same, the characteristic of the semiconductor laser 1 is considered to have been changed and the procedure advances to step 308 (S306).

In step S308, power control is stopped to detect the characteristic of the semiconductor laser once again. Then, the procedure goes back to step S301 and the target value is corrected based on the characteristic of the semiconductor laser 1 again, and in this way the desired outgoing radiation power of the semiconductor laser 1 can be obtained with high accuracy at temperature T2, too.

In step S307, it is judged through the control signal 11 whether power control operation should be stopped or not and if power control operation should be continued, the procedure advances to step S304 and if power control operation should be stopped, the procedure advances to S309.

Finally, power control operation is stopped and the procedure ends in step S309.

As shown above, in addition to detecting the characteristic of the semiconductor laser 1 before power control and correcting the target value 3 based on the threshold current and differential quantum efficiency obtained, the semiconductor laser control apparatus of the second embodiment detects the temperature of the semiconductor laser 1 during power control operation all the time and, if the temperature becomes equal to the temperature when the target value is corrected, detects the characteristic of the semiconductor laser 1 and corrects the target value once again. Thus, the desired outgoing radiation power can be obtained with high accuracy even if the threshold current or differential quantum efficiency of the semiconductor laser 1 changes due to temperature variations.

Moreover, the semiconductor laser control apparatus of the second embodiment has a configuration with only one target value. However, since correction of the target value is not dependent on the desired outgoing radiation power as is clear from the Equation 7, it is also possible to have a configuration with at least two target values and input a selected one to the target value correction means. In that case, it is possible to easily implement multi-value control of outgoing radiation power according to the number of target values.

Moreover, the semiconductor laser control apparatus of the second embodiment performs semiconductor laser characteristic detection and target value correction before power control operation, but it is also possible to save the last detected threshold current, differential quantum efficiency and the temperature of the semiconductor laser at that time and perform power control using the target value corrected based on these values first. In this case, it is possible to compare the target value 3 and the output of the power control means 2 when power control operation is stabilized and stop power control operation when the comparison result is not within the allowable error range, and perform power control operation after carrying out detection of the characteristic of the semiconductor laser 1, detection of temperature and correction of the target value. This is effective when the time required for detection of the characteristic of the semiconductor laser 1, detection of temperature and correction of the target value becomes a problem in the system using the semiconductor laser control apparatus of the second embodiment and deterioration of power accuracy caused by a correction shift is within an allowable range.

Furthermore, the semiconductor laser control apparatus of the second embodiment performs detection of the characteristic of the semiconductor laser and correction of the target value before power control operation, but it is also possible to perform power control operation without correcting the target value. In this case, it is also possible to compare the target value 3 and the output of the power control means 2 when power control operation is stabilized and stop power control operation if the comparison result is not within the allowable error range and detect the characteristic of the semiconductor laser 1, detect temperature and correct the target value and then operate power control once again. This is effective when the time required for detection of the characteristic of the semiconductor laser, detection of temperature and correction of the target value becomes a problem in the system using the semiconductor laser control apparatus of the second embodiment and deterioration of power accuracy caused by a correction shift is within an allowable range.

Furthermore, with the semiconductor laser control apparatus of the second embodiment, in step S306 in FIG. 5, whether temperature T2 during power control operation and temperature T1 when the characteristic of the semiconductor laser 1 is performed are the same or not is used for judgment, but if the system using the semiconductor laser control apparatus of the second embodiment contains the outgoing radiation power allowable error range with respect to temperature variations, it is also possible to obtain the allowable temperature variation range corresponding to the outgoing radiation power allowable error range and whether the difference between temperature T2 and temperature T1 is within the allowable temperature variation range or not is used for judgment. In this case, detection of the semiconductor laser characteristic and correction of the target value are performed less frequently, and so continuous power control operation lasts longer, proving effective in improving the system performance. Of course, it is also possible to provide at least two allowable temperature variation ranges and select one according to the outgoing radiation power accuracy required by the system.

Furthermore, with the semiconductor laser control apparatus of the second embodiment, the method of increasing the drive current for the semiconductor laser in the semiconductor characteristic detection procedure shown in FIG. 5 need not always have certain fixed increments, but can change the amount of increments according to, for example, whether a signal is output or not from the power detection means. Moreover, any concept of the drive current is acceptable as long as it provides the current-optical output characteristic of the semiconductor laser as a consequence. The drive current stop condition need not have the content shown in step S204 of FIG. 3 and any judgment criteria is acceptable as long as it allows the threshold current and differential quantum efficiency to be obtained stably.

Furthermore, the semiconductor laser control apparatus of the second embodiment uses the temperature detection means of the semiconductor laser 1, but any means can be used if it can at least estimate temperature even if it cannot directly measure temperature of the semiconductor laser 1. For example, even if the temperature detector is far from the semiconductor laser 1, there will be no problem if a one-to-one relationship is maintained. Moreover, if there exists a factor that determines the operating ambient temperature of the semiconductor laser 1 in its vicinity and the temperature of that factor is estimable, it is possible to estimate the temperature of the semiconductor laser 1 without using any temperature detector.

By the way, since the deterioration of life of a semiconductor laser shows the same characteristic change as that by temperature variations, the semiconductor laser control apparatus of the second embodiment is also effective against the deterioration of life of the semiconductor laser.

Figure 6:
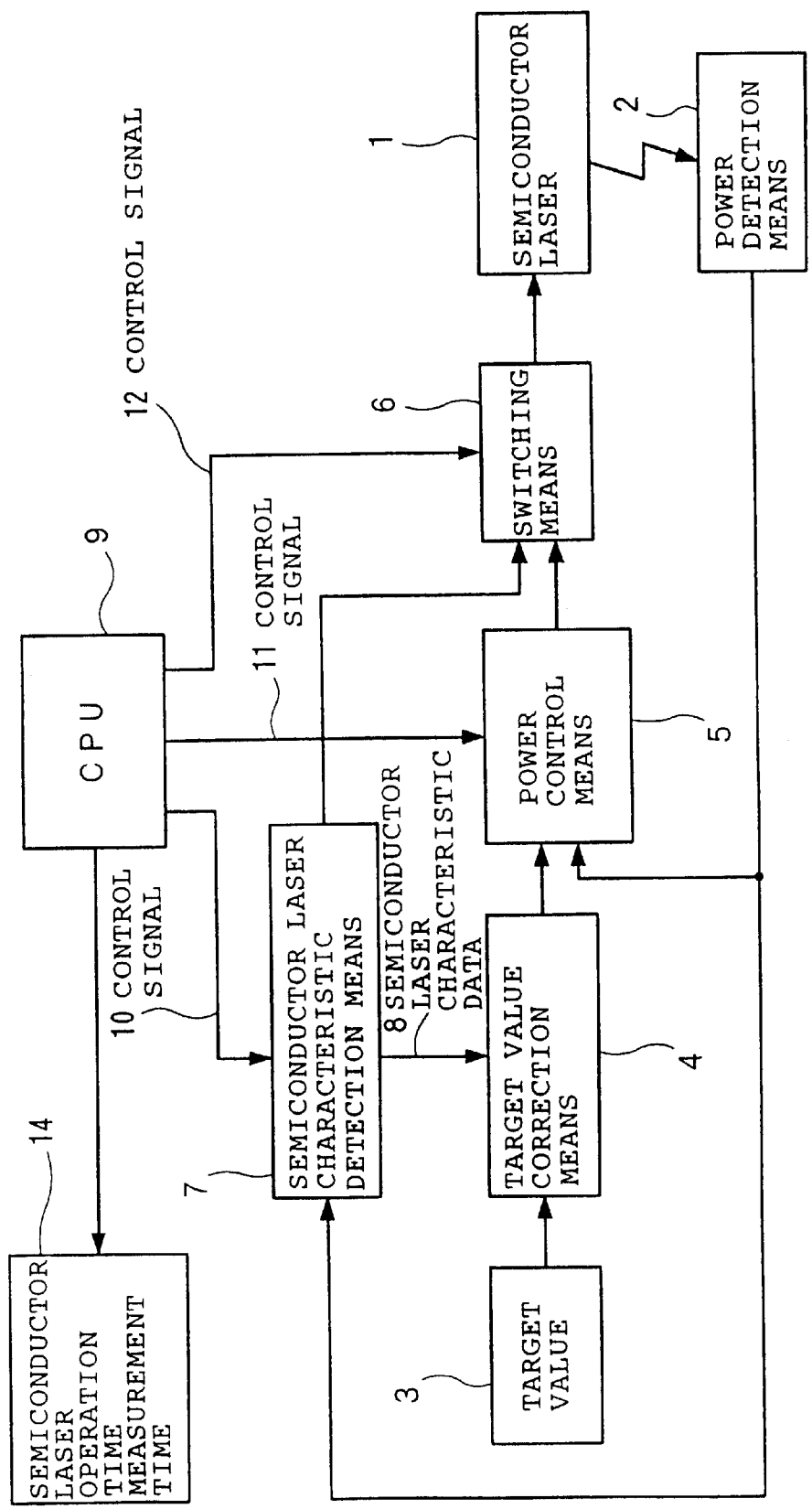
FIG. 6 is a block diagram showing an outlined configuration of a semiconductor laser control apparatus to explain a third embodiment of the present invention.

FIG. 6 is a block diagram showing an outlined configuration of a semiconductor laser control apparatus to explain a third embodiment of the present invention. In FIG. 6, the same components as those explained in FIG. 1 and FIG. 4 are assigned the same reference numerals and their detailed explanations are omitted. Reference numeral 14 denotes a semiconductor laser operation time measurement means.

Figure 7:
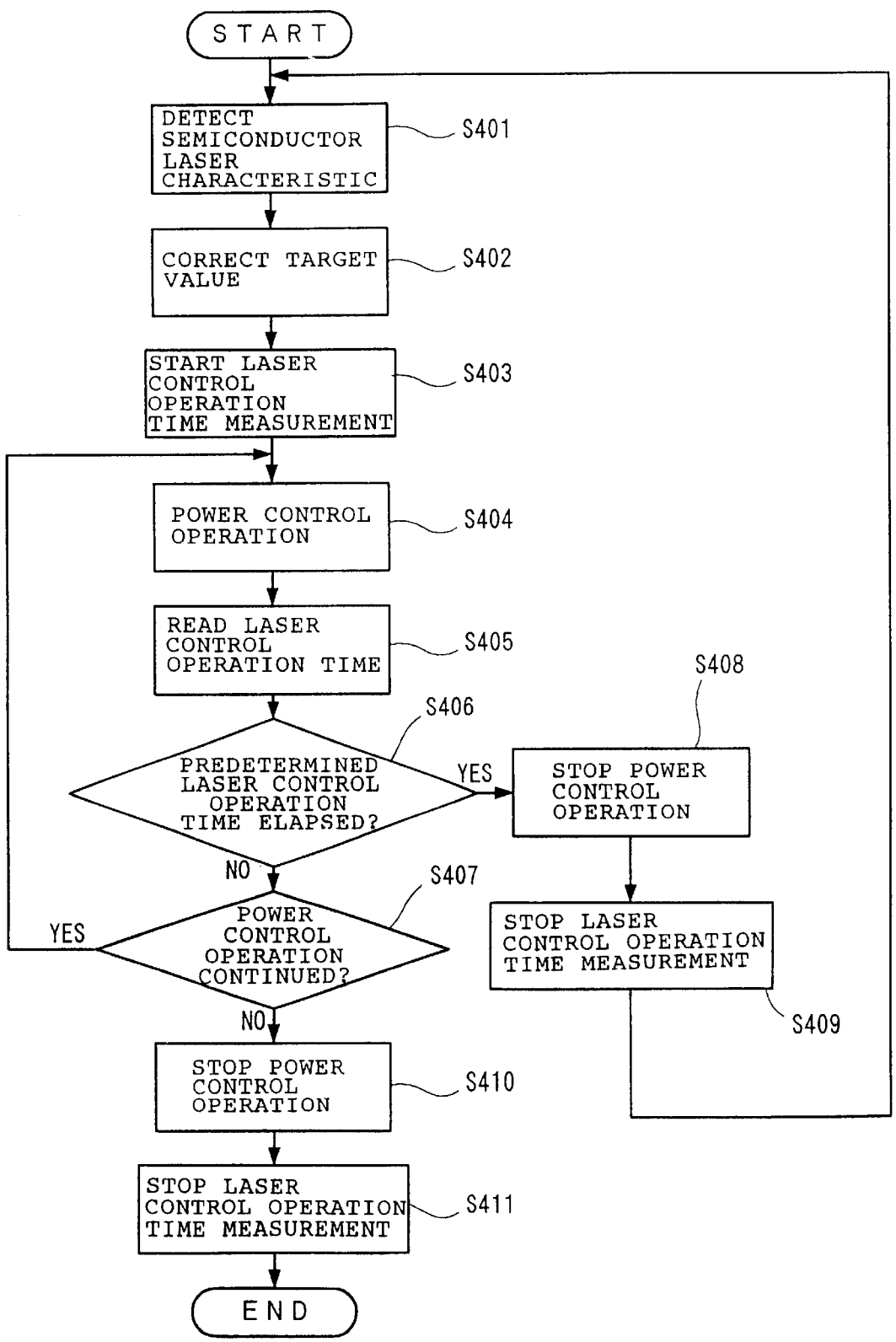
FIG. 7 is a flow chart showing an operation procedure of the third embodiment of the present invention.
Figure 8:
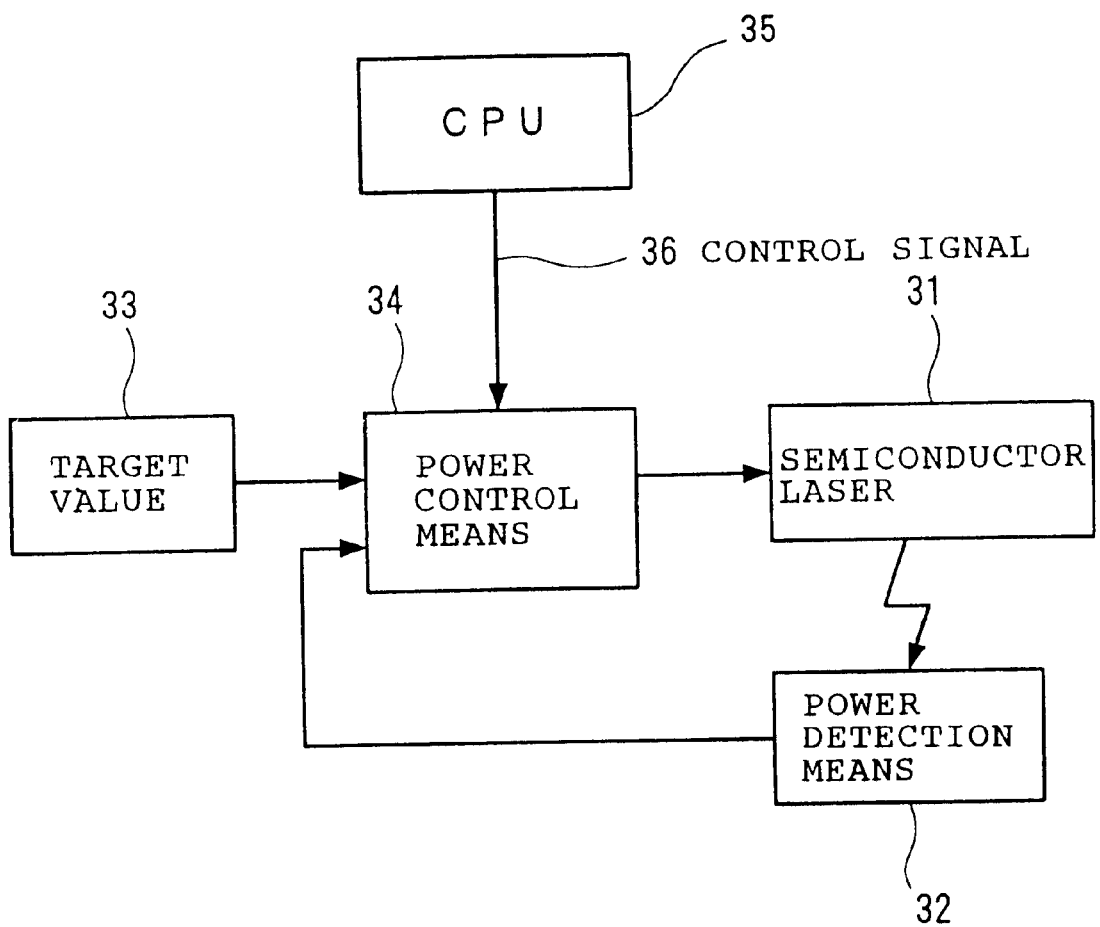
FIG. 8 is a block diagram showing a configuration example of a conventional semiconductor laser control apparatus.
Figure 9:
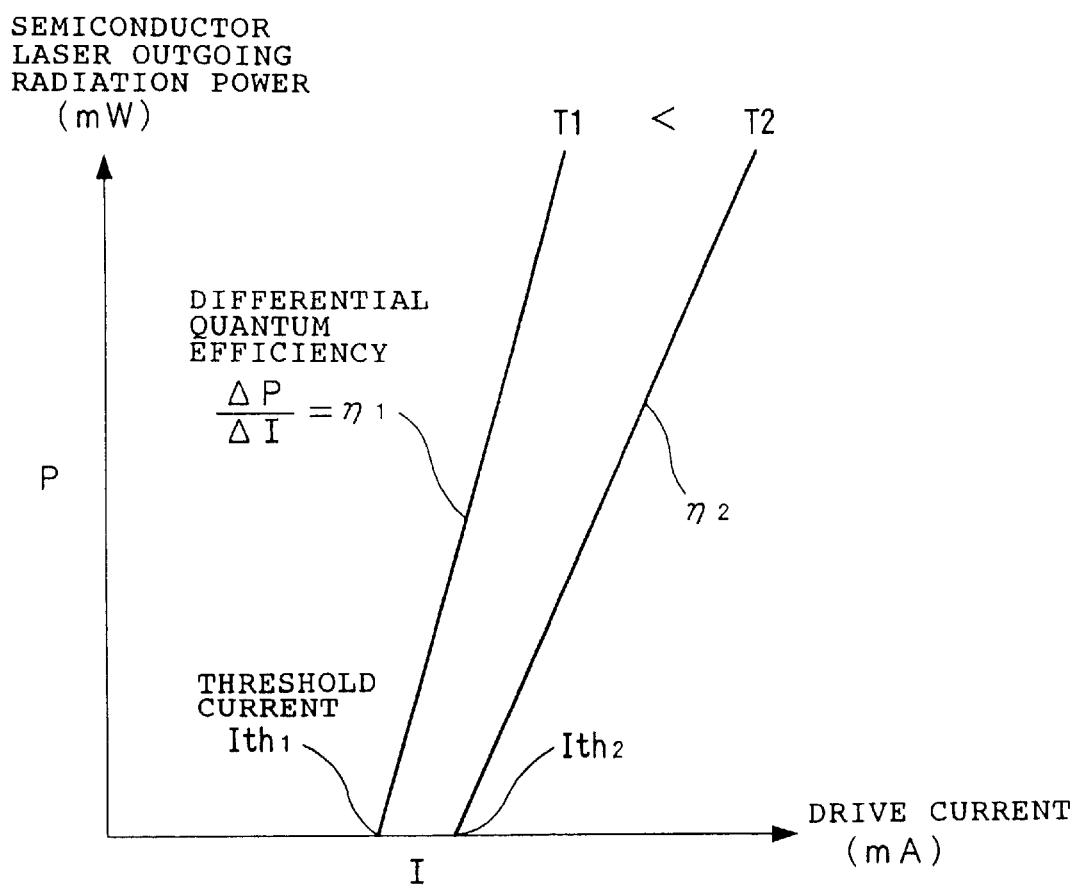
FIG. 9 is a drawing showing a current-optical output power characteristic of a semiconductor laser.

FIG. 7 is a flow chart showing the procedure for operating the components of the third embodiment.

First, steps S401 and S402 are carried out in FIG. 7. The procedure and content of each operation are the same as those in steps S101 and S102 in FIG. 2, and therefore their explanations are omitted.

Then, in step S403, the CPU 9 instructs the semiconductor laser operation time measurement means 14 to start measuring the semiconductor laser control operation time with step S403 as the starting point.

Step S404 has the same operation procedure and content as those in step S103, and therefore their explanations are omitted.

In step S405, the CPU 9 reads from the semiconductor laser operation time measurement means 14 the elapsed time after the semiconductor laser 1 starts power radiation operation through power control operation. Here in step S406, if the elapsed time read is within a predetermined time range in which some sign of deterioration of life is anticipated to occur in the semiconductor laser 1, it is judged that there is no change in the semiconductor laser characteristic due to the deterioration of life and the procedure advances to step S407. However, if the predetermined time range is exceeded, it is judged that there will be a change in the characteristic of the semiconductor laser 1 and the procedure advances to step S408.

In step S408, power control is stopped to detect the characteristic of the semiconductor laser again and in step S409 measurement of the semiconductor laser control operation time is stopped. Then, the procedure goes back to step S401 and the target value is corrected again based on the characteristic of the semiconductor laser 1 and in this way it is possible to obtain the desired outgoing radiation power of the semiconductor laser 1 accurately even if deterioration of life in the characteristic of the semiconductor laser is caused by operation over time.

In step S407, it is judged through the control signal 11 whether or not to stop power control operation and if power control operation is to be continued, the procedure advances to step S404 and if power control operation is to be stopped, the procedure advances to step S410.

Finally in step S410, power control operation is stopped and in step S411 measurement of the semiconductor laser control operation time is stopped and the procedure ends.

As shown above, the semiconductor laser control apparatus according to the third embodiment detects the characteristic of the semiconductor laser 1 before power control and corrects the target value 3 based on the threshold current and differential quantum efficiency calculated, and further measures the power control operation time during which the semiconductor laser performs power radiation and if this time exceeds a predetermined time estimated for a sign of deterioration of life to occur in the semiconductor laser 1, it is assumed that there is a change in the characteristic of the semiconductor laser 1 due to the deterioration of life and the semiconductor laser control apparatus detects the characteristic of the semiconductor laser 1 and corrects the target value again. Thus, even if the threshold current and differential quantum efficiency of the semiconductor laser 1 are affected by deterioration of life due to operation over time, it is possible to obtain desired outgoing radiation power accurately.

By the way, the semiconductor laser control apparatus according to the third embodiment starts laser control operation time measurement with step S403 as the starting point before power control operation, but it is also possible to consider the time at which process adjustment takes place under the initial condition as this starting point and accumulate all laser control operation times from that point. In this case, the time used for judgment in step S406 is also calculated as the accumulation time, but it is possible to improve the trackability in detection of deterioration of life by providing at least two accumulation times based on the life deterioration characteristic of the semiconductor laser 1.

Furthermore, the semiconductor laser control apparatus according to the third embodiment uses a single time for judgment in step S406, but it is also possible to provide at least two times and select one according to the accuracy of outgoing radiation power required by the system using the semiconductor laser control apparatus according to the third embodiment. Extending the judgment time in this way may deteriorate the accuracy of outgoing radiation power but extend continuous power control operation time, which is effective in improving the system performance.

Furthermore, the semiconductor laser control apparatus according to the third embodiment has a configuration with only one target value, but since correction of the target value is not dependent on the desired outgoing radiation power as is clear from the Equation 7, it is also possible to have a configuration with at least two target values and input a selected one to the target value correction means. In that case, it is possible to easily implement multi-value control of outgoing radiation power according to the number of target values.

Moreover, the semiconductor laser control apparatus of the third embodiment performs semiconductor laser characteristic detection and target value correction before power control operation, but it is also possible to save the last detected threshold current, differential quantum efficiency, and perform power control first using the target value corrected based on these values. In this case, it is possible to compare the target value 3 and the output of the power detection means 2 when power control operation is stabilized and stop power control operation when the comparison result is not within the allowable error range, and perform power control operation again after carrying out detection of the characteristic of the semiconductor laser 1, correction of the target value and starting measurement of laser control operation time. This is effective when the time required for detection of the characteristic of the semiconductor laser and correction of the target value becomes a problem in the system using the semiconductor laser control apparatus of the third embodiment and deterioration of power accuracy caused by a correction shift is within an allowable range.

Furthermore, the semiconductor laser control apparatus of the third embodiment performs detection of the characteristic of the semiconductor laser and correction of the target value before power control operation, but it is also possible to perform power control operation without correcting the target value. In this case, it is also possible to compare the target value 3 and the output of the power detection means 2 when power control operation is stabilized and stop power control operation if the comparison result is not within the allowable error range and detect the characteristic of the semiconductor laser 1, correct the target value and start measurement of laser control operation time, and then operate power control again. This is effective when the time required for detection of the characteristic of the semiconductor laser and correction of the target value becomes a problem in the system using the semiconductor laser control apparatus of the third embodiment and deterioration of power accuracy caused by a correction shift is within an allowable range.

It goes without saying that the semiconductor laser control apparatus of the third embodiment can easily be combined with the semiconductor laser control apparatus of the second embodiment and in that case it is possible to implement a semiconductor laser control apparatus with fewer outgoing radiation power errors with respect to temperature variations or deterioration of life of the semiconductor laser.

As shown above, the present invention can achieve desired outgoing radiation power of the semiconductor laser with high accuracy by correcting a target value based on the threshold current and differential quantum efficiency obtained by detecting the characteristic of the semiconductor laser even if the threshold current and differential quantum efficiency of the semiconductor laser change.

Furthermore, detecting the temperature of the semiconductor laser allows the target value to be corrected by detecting threshold current and differential quantum efficiency of the semiconductor laser according to temperature variations of the semiconductor laser, thus achieving the desired outgoing radiation power of the semiconductor laser with high accuracy against temperature variations.

Furthermore, measuring operation time of the semiconductor laser makes it possible to detect the threshold current and differential quantum efficiency and correct the target value of the semiconductor laser according to operation of the semiconductor laser over time, thus achieving the desired outgoing radiation power of the semiconductor laser with high accuracy against deterioration of life.

What is claimed is:

1. A semiconductor laser control method for detecting outgoing radiation power of a semiconductor laser by a power detecting unit and controlling the outgoing radiation power of the semiconductor laser by a power controlling unit to a desired power level by comparing the output value of this power detecting unit with a target value, wherein the desired outgoing radiation power is obtained from the semiconductor laser by flowing an arbitrary inspection current into the semiconductor laser, by obtaining a characteristic of the semiconductor laser from this current value and detected power and by correcting the target value based on this characteristic.

2. The semiconductor laser control method according to claim 1, wherein said characteristic is a threshold current and differential quantum efficiency of the semiconductor laser.

3. The semiconductor laser control method according to claim 1, wherein the target value is corrected before a power control operation.

4. The semiconductor laser control method according to claim 1, wherein the corrected target value in the last power control operation is saved and the next power control operation is carried out by using said corrected target value.

5. The semiconductor laser control method according to claim 1, wherein if a certain condition regarding power accuracy is not satisfied during a power control operation, said target value is corrected based on said characteristic of the semiconductor laser to continue power control.

6. The semiconductor laser control method according to claim 5, wherein the temperature of the semiconductor laser is detected and said target value is corrected when this temperature detected value meets a certain condition.

7. The semiconductor laser control method according to claim 5, wherein an accumulation operation time of the semiconductor laser is measured and said target value is corrected when this accumulation operation time meets a certain condition.

8. A semiconductor laser control apparatus comprising:

a power detecting unit to detect outgoing radiation power of a semiconductor laser;

a power controlling unit to control the outgoing radiation power of the semiconductor laser to a desired power level by comparing the output value of this power detecting unit with a target value;

a semiconductor laser detecting unit to detect a characteristic of the semiconductor laser; and a target value correcting unit to correct said target value, wherein the desired outgoing radiation power is obtained from the semiconductor laser by correcting the target value by said target value correcting unit based on the characteristic of the semiconductor laser obtained by said semiconductor laser characteristic detecting unit.

9. The semiconductor laser control apparatus according to claim 8, wherein said characteristic is a threshold current and differential quantum efficiency of the semiconductor laser.

10. The semiconductor laser control apparatus according to claim 8, further comprising a temperature detecting unit capable of detecting or estimating the temperature of the semiconductor laser to determine timing for correcting the target value.

11. The semiconductor laser control apparatus according to claim 8, further comprising a semiconductor laser accumulation operation time measuring unit to determine timing for correcting the target value.

* * * * *